United States Patent
Bautista, Jr. et al.

(10) Patent No.: US 6,385,093 B1
(45) Date of Patent: May 7, 2002

(54) I/O PARTITIONING SYSTEM AND METHODOLOGY TO REDUCE BAND-TO-BAND TUNNELING CURRENT DURING ERASE

(75) Inventors: Edward V. Bautista, Jr., Santa Clara; Kazuhiro Kurihara, Sunnyvale; Feng Pan, Richmond; Weng Fook Lee, Santa Clara; Ravi Sunkavalli, Milpitas; Darlene Hamilton, San Jose, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/822,995

(22) Filed: Mar. 30, 2001

(51) Int. Cl.$^7$ ................................................ G11C 16/04
(52) U.S. Cl. .............................. 365/185.29; 365/185.11; 365/185.19
(58) Field of Search ....................... 365/185.29, 185.28, 365/185.19, 185.11

(56) References Cited

U.S. PATENT DOCUMENTS

| | | | | |
|---|---|---|---|---|
| 5,339,279 A | | 8/1994 | Toms et al. ................. | 365/185 |
| 5,699,298 A | * | 12/1997 | Shiau ..................... | 365/185.15 |
| 5,814,853 A | | 9/1998 | Chen ......................... | 257/315 |
| 6,049,479 A | | 4/2000 | Thurgate et al. ....... | 365/185.18 |
| 6,057,575 A | | 5/2000 | Jenq .......................... | 257/319 |
| 6,188,609 B1 | * | 2/2001 | Sunkavalli ............. | 365/185.22 |

* cited by examiner

Primary Examiner—A. Zarabian
(74) Attorney, Agent, or Firm—Eschweiler & Associates, LLC (57) ABSTRACT

A system is provided for reducing band-to-band tunneling current during Flash memory erase operations. The system includes a memory sector divided into (N) I/O subsectors, N being an integer, and a drain pump to generate power for associated erase operations within the N I/O subsectors. An erase sequencing subsystem generates N pulses to enable the erase operations within each of the N I/O subsectors in order to reduce band-to-band tunneling current provided by the drain pump.

33 Claims, 7 Drawing Sheets

I/O PARTITIONING SYSTEM AND METHODOLOGY TO REDUCE BAND-TO-BAND TUNNELING CURRENT DURING ERASE

FIELD OF THE INVENTION

The present invention relates generally to Electrically Erasable Programmable Read Only Memory (EEPROM), and more particularly relates to a system and method for reducing band-to-band tunneling current during a Flash EEPROM erase cycle via memory I/O partitioning of the erase cycle.

BACKGROUND OF THE INVENTION

Memory devices, such as Electrically Erasable Programmable Read Only Memories (EEPROMs), are an important architectural component in modern computing systems. These systems affect many aspects of society ranging from the home to business and education. For example, wireless systems, such as cell phones, have become a staple in many people's day-to-day lives. As this technology and others have advanced however, system requirements have become increasingly demanding for systems designers and architects. One important demand has been the need for smaller memory packaging with increased memory density in order to provide ever more functionality in smaller portable computing systems such as cell phones and other hand held systems such as Personal Digital Assistants (PDAs) and pagers.

Flash EEPROMs enable computing systems to store large amounts of program data that generally provide instructions to an associated computer processing system. An advantage to Flash memory is the ability to electrically re-program the memory via program and erase operations associated with the Flash. Thus, if a manufacturer desires to correct a product bug and/or provide an updated product feature, the Flash memory may be easily re-programmed without having to replace components within the given product. As described above, as technology demands have increased, density and packaging requirements for Flash memories have also steadily increased. Unfortunately, as memory density requirements increase, challenges relating to Flash program and erase operations have increased.

One such challenge associated with Flash memories relates to increased current requirements during memory cell/sector erase operations. Memory cells generally may be described by a MOS structure wherein a voltage is applied to a cell gate element with respect to cell drain and source elements in order to store or remove charge associated with charge trapping regions within the cell structure. Erase operations to a cell may be provided, for example, by applying a negative voltage to the gate element and an elevated voltage to the drain element via a drain pump. As an erase is performed, a current known as band-to-band tunneling current is generated by the drain pump as a result of removing stored electrons from the charge trapping regions of the cell structure. As is the case with high-density flash structures, hundreds of thousands or millions of such cells may be programmed/erased concurrently. Consequently, band-to-band tunneling current requirements for the drain pump power supply may increase dramatically depending on the particular type of flash technology employed and the amount of cells that are concurrently erased/programmed.

Increased band-to-band tunneling current requirements, however, may cause problems for the associated drain pump. For example, increased current may cause increased IR drops within the memory device and therefore lead to a reduction in drain pump output voltage. If the drain pump output voltage is reduced, errors may occur during Flash erase or programming operations, wherein memory cells are improperly or impartially erased/programmed. Presently, conventional Flash erase systems may cause increased band-to-band tunneling current problems. This may occur since entire memory segments (e.g., 1 Megabyte, ½ Megabyte) are generally programmed with a single erase pulse and/or sequence. Consequently, it would therefore be desirable to improve upon conventional Flash erase systems and methods in order to reduce band-to-band current requirements.

SUMMARY OF THE INVENTION

The present invention relates to a system and method for reducing band-to-band tunneling current requirements during Flash EEPROM erase operations. This may be achieved by partitioning a sector of a Flash memory into N I/O subsectors, wherein N is an integer, and providing an erase pulse to each of the N I/O subsectors, respectively. Band-to-band tunneling current requirements are reduced since each I/O subsector erase operation requires less tunneling current than required for an entire sector erase operation. Furthermore, drain pumps supplying the band-to-band tunneling current may be designed with lower power and size requirements than conventional systems.

As will be described in more detail below, I/O and related erase partitioning may be applied during some erase operations and not applied during subsequent erase operations. For example, a sector may be erased via a plurality of pulses applied to individual I/O subsectors of the sector. After the partitioned erase, a verify operation commences wherein the sector is checked to determine if all the memory locations have been properly erased. If all the memory locations have not been erased, a subsequent partitioned erase sequence may commence with an associated subsequent verify sequence. If all the memory locations have still not been erased properly after the subsequent verify sequence, a full sector erase may then be initiated wherein all the N I/O subsectors are erased concurrently. Subsequent full sector erases may be commenced since most of the cells in the partitioned sector have been previously erased during the partitioned erase sequence described above. Thus, full sector erases after initial erase partitioning may be commenced without overloading the associated drain pump.

To the accomplishment of the foregoing and related ends, the invention comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The following is a detailed description of the present invention made in conjunction with the attached Figures, wherein like reference numerals refer to like elements throughout.

The present invention relates to a system and methodology for reducing band-to-band tunneling current within a Flash memory during erase operations. This may be achieved by partitioning a sector of the memory into "N" I/O subsectors, N being an integer, and erasing each I/O subsector via an associated erase pulse applied to each I/O subsector. As will be described in more detail below, an erase sequencing system is provided to generate an erase pulse for each of the N I/O subsectors to facilitate a partitioned erase of the sector. The erase sequencing system may further alternate to full erase operations for the entire sector after a predetermined number (e.g., 2, 3) of partitioned erase sequences. Moreover, the erase partitioning provided by the present invention may be applied to a plurality of Flash technologies such as multi-storage bit cell architectures as well as to single-bit storage architectures in order to reduce band-to-band tunneling current related thereto.

Figure 1A:
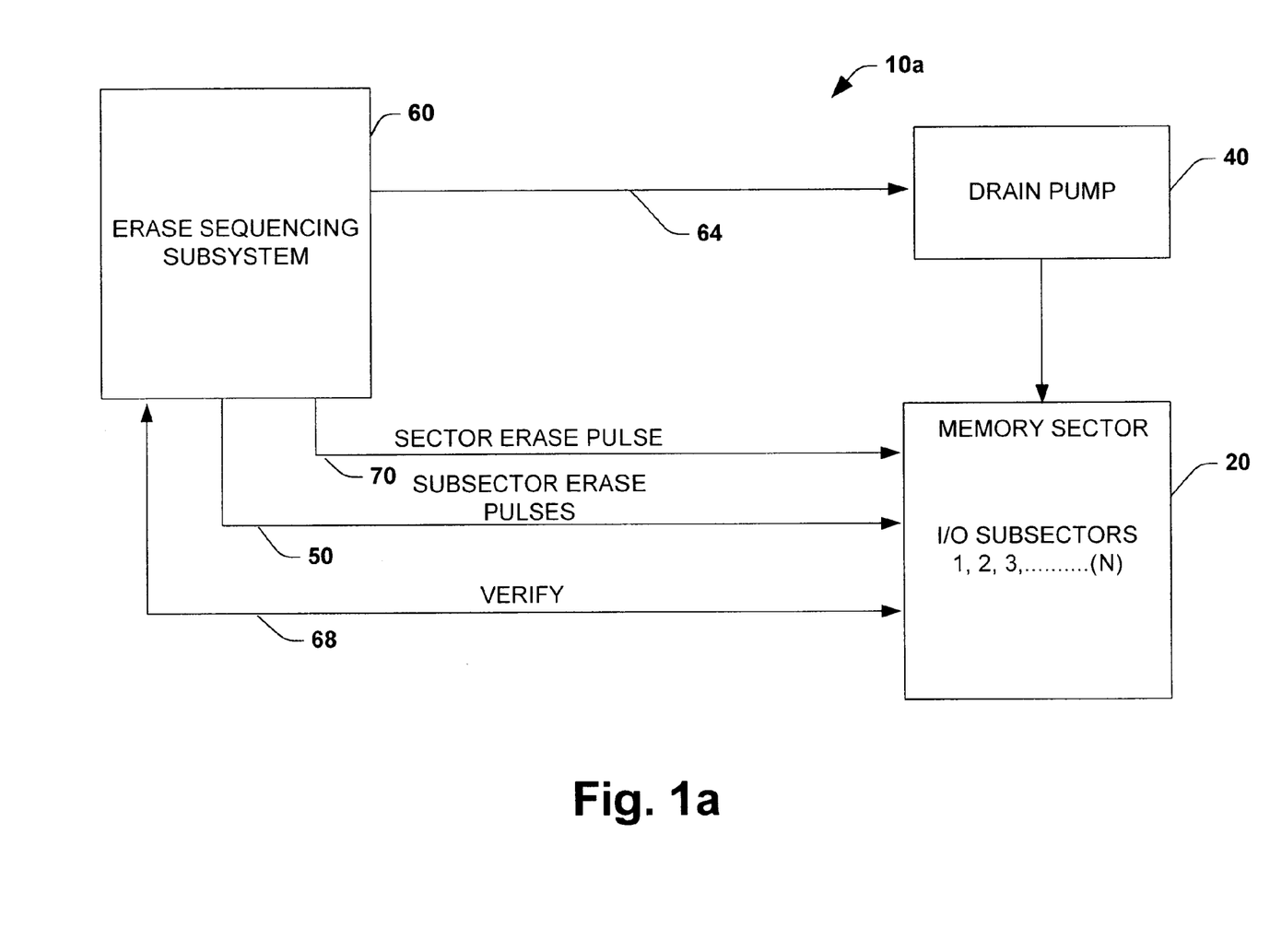
FIG. 1a is a schematic block diagram illustrating an I/O erase partitioning system in accordance with an aspect of the present invention.

Referring initially to FIG. 1a, an exemplary I/O partitioning system 10a is illustrated in accordance with an aspect of the present invention for reducing band-to-band tunneling current associated with an erase operation of a Flash memory sector 20. Although one exemplary sector is illustrated in FIG. 1a, it is to be appreciated that a plurality of sectors may also be included within a Flash memory device (not shown) and erased in accordance with the present invention. The memory sector 20 is partitioned into I/O subsectors 1 through "N", N being an integer, in order to reduce current supplied from a drain pump 40 during memory erase operations. This is achieved by providing at least one I/O subsector erase pulse 50 per subsector 1 through N, and erasing the memory sector 20 via a partitioned erase, wherein portions of the memory sector 20 are sequentially erased. The drain pump 40 supplies elevated voltages to the memory sector 20 in order to enable erase or programming operations as will be described in more detail below.

During erase operations of the memory sector 20, an erase sequencing subsystem 60 generates an erase pulse 50 per I/O subsector 1 through N, and enables the drain pump 40 via an output signal 64. After generating the erase pulses 50, the erase sequencing subsystem 60 disables the drain pump 40 and initiates a verify signal 68 of the memory sector 20 to determine if the erase operation has been successful. The verify signal 68 may include reading memory locations/cells within the memory sector 20 and determining if the locations have been erased. Erase verification may include, for example, determining whether each memory cell is above (e.g., erase fail) or below (e.g., erase pass) a predetermined threshold voltage or current. If the erase sequencing subsystem 60 determines that portions of the memory sector 20 have not been erased fully or adequately, a second and/or subsequent erase/verify sequence may be initiated.

In accordance with the present invention, subsequent erase/verify sequences of the memory sector 20 may include partitioned erases, as described above, of the I/O subsectors 1 through N via the pulses 50. Alternatively, the subsequent erases may include a sector erase of all I/O subsectors, wherein all I/O subsectors are erased concurrently, via a single sector erase pulse 70. It has been found that after an initial partitioned erase or sequence of partitioned erases of the memory sector 20, that all memory sectors may then be erased substantially at the same time without adversely affecting the drain pump 40. For example, the erase sequencing subsystem 60 may initiate a first and second partitioned erase of the memory sector 20. If after the second partitioned erase, the verify 68 still fails, the erase sequencing subsystem 60 may initiate an erase of all I/O subsectors 1 through N concurrently via the sector erase pulse 70. It is to be appreciated that the erase sequencing subsystem 60 may be configured to provide substantially any combination of partitioned erases and/or sector erases and such alternatives are understood to be within the scope of the present invention. For example, the erase sequencing subsystem 60 may initiate only partitioned erases, or may initiate one or more partitioned erases followed by one or more sector erases of the memory sector 20.

Figure 1B:
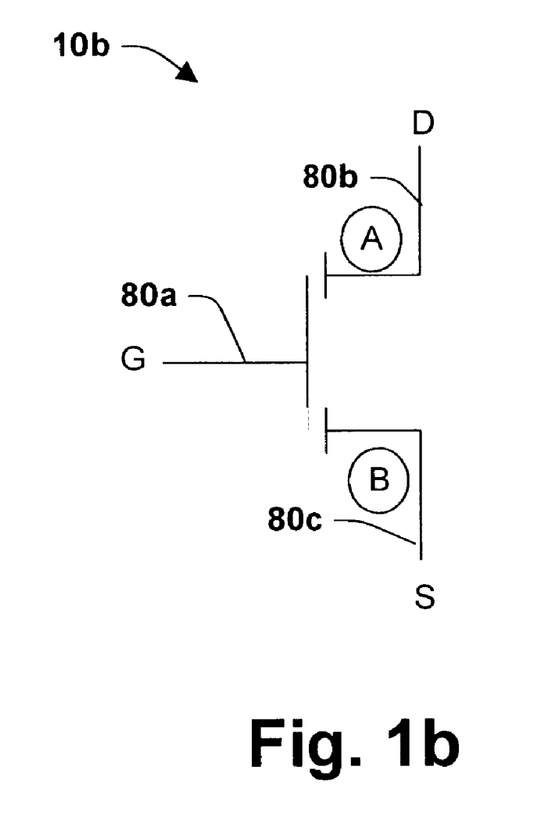
FIG. 1b is a schematic diagram of a multi-bit memory cell in accordance with an aspect of the present invention.
Figure 1C:
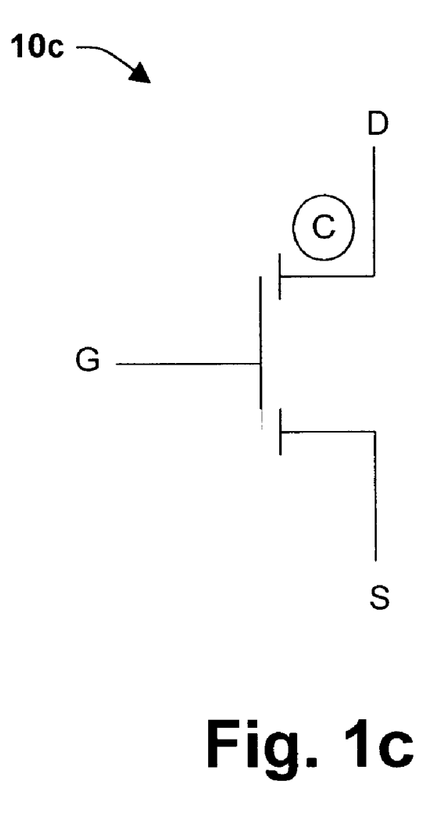
FIG. 1c is a schematic diagram of a single-bit memory cell in accordance with an aspect of the present invention.

Referring now to FIGS. 1b and 1c, an exemplary multi-bit and single bit Flash memory cell architecture are illustrated in accordance with the present invention. For example, FIG. 1a depicts a schematic diagram of a dual bit architecture 10b wherein more than one bit may be programmed and erased per memory cell. A gate terminal 80a is provided in conjunction with a drain terminal 80b and source terminal 80c and generally provides a Metallic Oxide Semiconductor (MOS) structure as is well understood. It is understood that two regions, an A and B region for example, may be programmed within the structure 10b by alternating programming and erase directions across the structure 10b. For example, programming operations may be achieved by providing a positive voltage to the gate element 80a, and directing an elevated drain pump voltage to the drain 80b in order to store electrons within the A region of the structure 10b. Similarly, if the drain pump is applied to the source terminal 80c, electrons may be stored within the B region of the structure 10b. Erase operations may be similarly achieved by supplying a negative voltage to the gate 80a and subsequently applying the elevated drain pump voltage to the drain 80b or source 80c, to erase region A or B, respectively.

As will be described in more detail below, the erase sequencing subsystem 60 depicted in FIG. 1a, may be configured to provide alternative erase operations and sequences to the multi-bit structure 10b. For example, the structure 10b may be erased according to a partitioned erase for region A via the erase pulses 50 and a sector erase of region B per the sector erase pulse 70 as depicted in FIG. 1a. As illustrated in FIG. 1c, a single bit cell architecture (e.g., a conventional stacked gate type cell or a dual bit cell wherein only one side is utilized) 10c may also be erased in accordance with the present invention wherein a single bit storage region C is provided per memory cell.

Figure 2A:
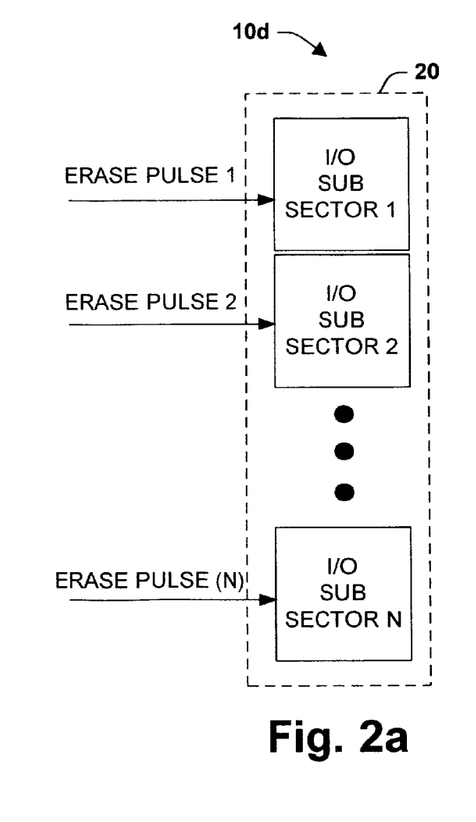
FIG. 2a is a block diagram illustrating an (N) sector erase sequence in accordance with an aspect of the present invention.

Turning now to FIG. 2a, an exemplary partitioned memory sector 10d is illustrated in accordance with the partitioned erase sequence of the present invention. As described above, the memory sector 10d may be included along with a plurality of sectors within a Flash memory architecture/device (not shown). For example, the memory sector 10d may include a plurality of memory cells as depicted in FIGS. 1b and 1c, wherein a sector provides a logical grouping of memory cells (e.g., ¼, ½, 1, 2 Mbytes). In accordance with the present invention, each memory sector 10d may be further subdivided into I/O subsectors 1 through N, wherein each I/O subsector may be sequentially erased per a subsector erase pulse 1 through N, respectively. For example, the memory sector 10d may be divided into 16 subsectors and may be sequentially erased via 16 associated erase pulses that occur sequentially in time. It is to be appreciated that a plurality of I/O subsector partitions (e.g., 8, 32, 64, etc.) may be similarly employed. Alternatively, all the pulses 1 through N may be concurrently asserted in order to provide a sector erase of the memory sector 10d. As described above, sector erases may be provided after initial subsector erases without affecting drain pump operations since most of the cells have previously been erased during one or more previous partitioned erase operations.

Figure 2B:
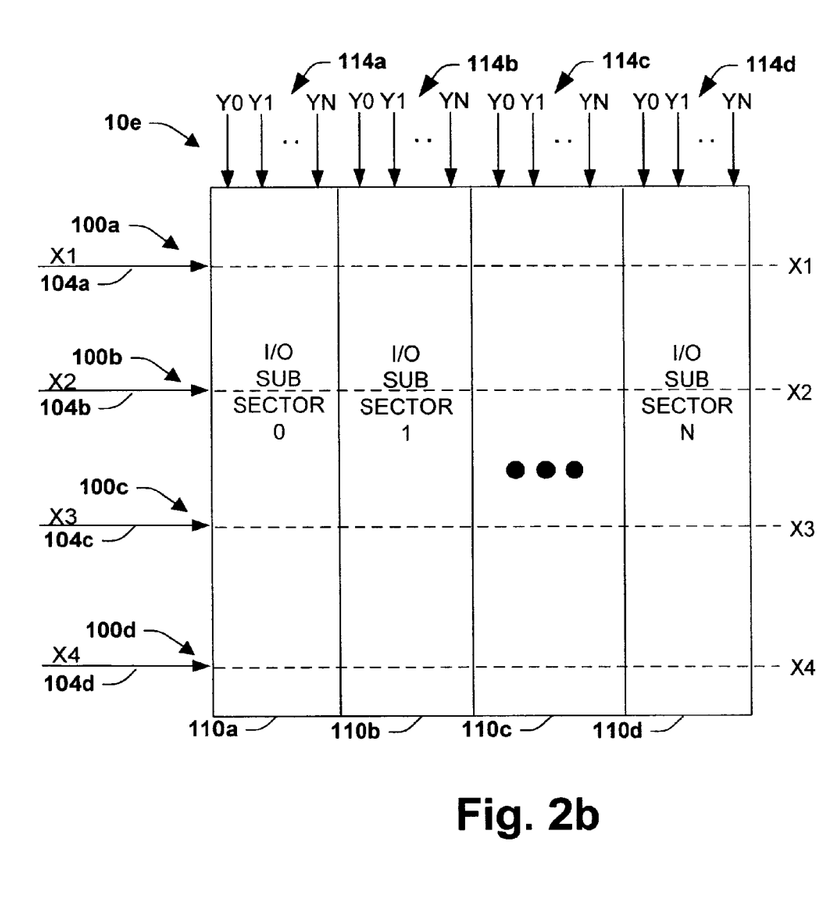
FIG. 2b is a block diagram illustrating an (N) sector matrix erase sequence in accordance with an aspect of the present invention.

Referring briefly to FIG. 2b, an exemplary memory sector organized as a memory array 10e is illustrated in accordance with the present invention. Although the structure depicted in FIG. 2a illustrates a logical relationship between I/O subsectors and erase pulses, it is to be appreciated that the I/O subsectors 0 through N may organized into a row/column array and/or matrix. For example, the array 10e may include four rows 100a–100d which are selected via row pulses 104a through 104d, and N columns 110a –110d which are selected via column pulses (Y1, Y2, . . . YN) 114a–114d. As an example, I/O subsector N may be erased by asserting a pulse 104a concurrently with the column pulses (Y1, Y2, . . . YN) 114d. It is to be appreciated that other matrix groupings or arrays may be employed (e.g., 2×2, 3×3, 5×5, N×N etc.) and such alternatives are contemplated as falling within the scope of the present invention.

Figure 3A:
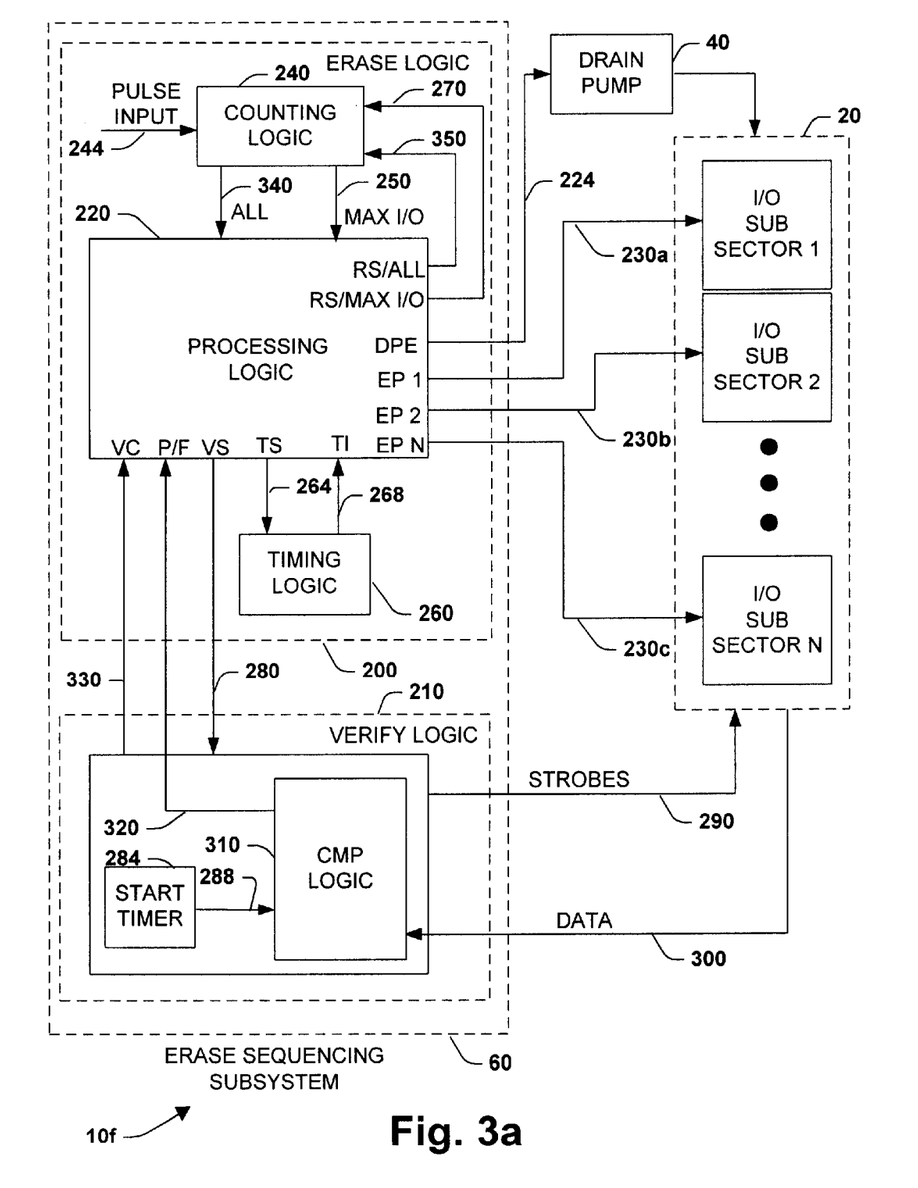
FIG. 3a is a schematic block diagram illustrating an exemplary erase sequencing system in accordance with an aspect of the present invention.

Turning now to FIG. 3a, an exemplary partitioned erase system 10f which includes an erase sequencing subsystem 60, drain pump 40, and memory sector 20 is illustrated in accordance with one particular aspect of the present invention. It is to be appreciated that although the following description provides one possible architecture for the erase sequencing subsystem 60 of the present invention, that substantially any suitable system providing partitioned and/or alternating erase sequences may be employed and are within the scope of the present invention. For example, the following logical/functional description may be implemented via hardwired logic, state machine logic, processed logic, wherein a processing function executes the described functionality via software, and/or combinations thereof.

Figure 3B:
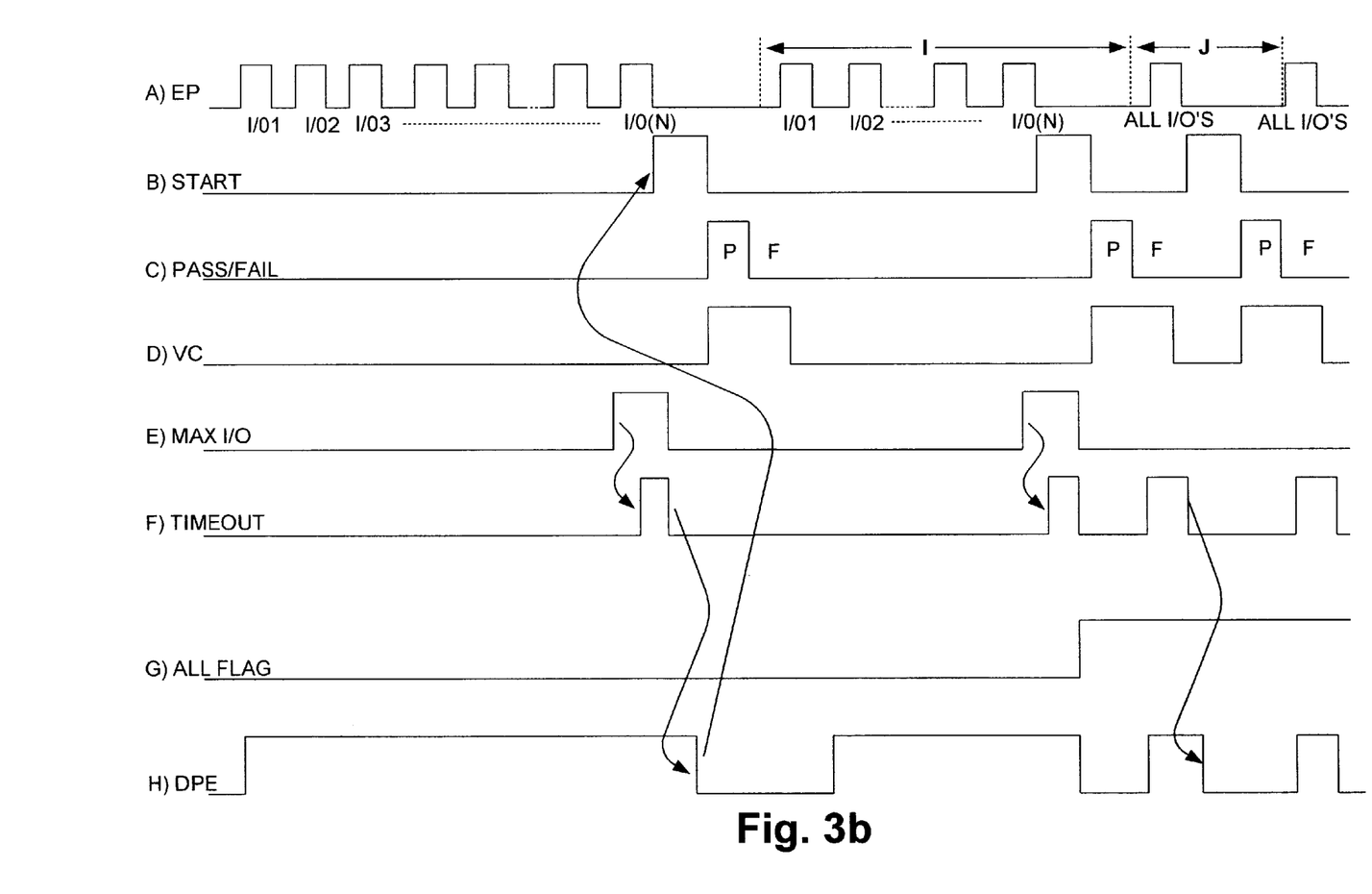
FIG. 3b is a timing diagram relating to an exemplary erase sequencing system in accordance with an aspect of the present invention.

The system 10f illustrated in FIG. 3a will also be described in reference to an exemplary timing diagram illustrated in FIG. 3b. The erase sequencing subsystem 60 of FIG. 3a may include an erase logic portion 200 and a verify logic portion 210 to provide the erase and verification of the memory sector 20, as described above. An initial erase sequence may begin by a processing logic portion 220 asserting a drain pump enable signal (DPE) 224 to enable the drain pump 40. The DPE signal in this particular example is illustrated at line H in FIG. 3b. A sequence of erase pulses 230a through 230c may then be initiated by the processing logic 220 and directed to the I/O subsectors 1 through N of the memory sector 20 to provide a partitioned erase in accordance with the present invention. An exemplary sequence of 16 erase pulses (I/O1, 1/O2, . . . I/O(N)) is depicted at line A in FIG. 3b. Because each of the erase pulses are substantially sequential, the power draw on the drain pump 40 is diminished substantially, thereby reducing advantageously band-to-band tunneling current.

The erase logic 200 also may include counting logic 240 in order to count the sequence of pulses 230a–230c that have been generated. For example, the counting logic 240 may include a pulse input 244 which is incremented each time an erase pulse 230a–230c is generated. Upon a predetermined number (e.g., 16), the counting logic asserts a MAX I/O flag 250 to indicate that all of the I/O subsectors I through N have received their respective erase pulses 230a–230c. The MAX I/O flag 250 is illustrated at line E of FIG. 3b. Upon receiving the MAX I/O flag, the processing logic 220 may then start a timeout timer 260 via a start timer output 264. When the timeout timer 260 times out, a timer output signal 268 (depicted at line F of FIG. 3b) is then provided to an input of the 10 processing logic 220, wherein the processing logic then disables the drain pump via the DPE signal 224. The MAX I/O signal may also be reset via a reset output 270 after the timer output signal 268 is asserted.

After the drain pump 40 has been disabled, a verify sequence may be initiated via a verify start signal 280 by the processing logic 220 to the verify logic 210. A start timer 284 in this particular example is then initiated and at the timeout of the timer 284, a verify operation is started. A start timer output 288 initiates the verify sequence and is illustrated at line B of FIG. 3b. The verify logic 210 then begins the verify sequence by asserting strobes 290 (e.g., address/control signals) to the memory sector 20 and reading data 300 from each memory location within the memory sector 20. The verify logic 210, may include comparison logic 310 for determining whether all memory locations have been erased completely or adequately (as may be defined by a user/tester). For example, if voltages or current read from the memory sector 20 are below a predetermined threshold, the associated memory location may be considered erased. If the voltages or currents are above a predetermined threshold, however, the associated memory location is not erased.

Upon completion of the memory verification, the comparison logic 310 may assert a pass/fail indication flag signal 320 along with a verification complete signal 330. If the pass/fail flag 320 is asserted (e.g., high logic signal) at the end of the verification sequence as indicated by the verification complete signal 330, a subsequent memory sector may then be erased in accordance with the present invention. If the pass/fail flag is un-asserted (e.g., low logic signal) at the end of the verification sequence, another erase sequence of the present memory sector may be initiated by the processing logic 220. The pass/fail signal 320 and verification complete signal 330 are illustrated in lines C and D in FIG. 3b, respectively.

In accordance with the present invention, a subsequent erase sequence may be initiated to the memory sector 20 if a fail flag has been returned by the verify logic 210. This sequence is illustrated at reference section I in FIG. 3b. After completion of a subsequent partitioned erase, the counting logic 240 may assert an all flag 340 indicating that the next erase sequence, if necessary, is to be applied to the entire I/O sector 20 concurrently rather than sequentially. For example, the all flag 340 may be asserted after counting 32 erase pulses indicating that a predetermined number of partitioned erases have previously occurred. When the processing logic 220 detects the assertion of the all flag 340, subsequent erases directed at the memory sector 20 may be provided in a concurrent manner, wherein all of the I/O subsectors 1 through N are pulsed at substantially the same time. An all flag signal is depicted at line G of FIG. 3b, and an all sector erase is depicted at section J of FIG. 3b. As illustrated in FIG. 3a, the all flag may be reset by the processing logic 220 via a reset output 350. By sequencing and alternating the erase pulses 230a –230c to the memory sector 20, the current required from the drain pump 40 is reduced. Thus, the drain pump 40 may be designed with lower power and reduced geometry circuit requirements than with conventional systems.

Figure 3C:
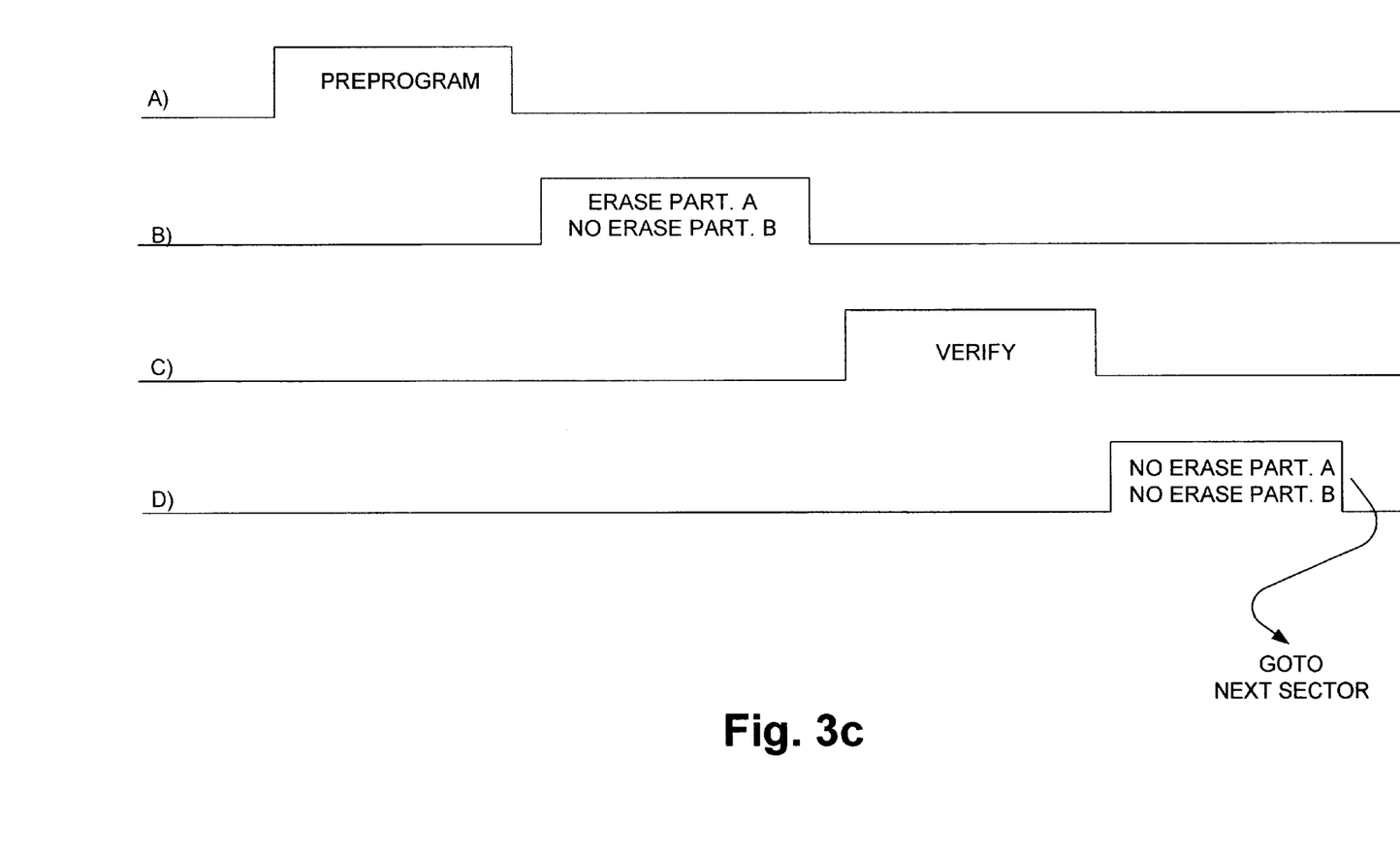
FIG. 3c is a timing diagram relating to an exemplary sector erase sequence in accordance with an aspect of the present invention.

Referring now to FIG. 3c, an exemplary erase sequence is provided for a dual memory bit architecture having a region A and a region B per memory cell in accordance with the present invention. The erase sequence may begin, for example, by first preprogramming the memory sector 20 with a known pattern (e.g., all 1's) and is depicted at line A of FIG. 3c. All region A memory portions of the I/O sector 20 may then be erased in accordance with erase partitioning as described above. The erase pulses applied to each I/O subsector may be about 10 milliseconds in width, for example. All region B memory portions may then be erased without erase partitioning via a single pulse of about 1 millisecond applied to all B regions concurrently (e.g., when using only one bit of two bit cell). The first period of erase sequences for region A and region B is illustrated at line B in FIG. 3c. A verify determination is then performed after the region A and region B erase sequences have been performed and is illustrated at line C in FIG. 3c. If any fail indications are asserted after the verify determination of line 3c, a subsequent sector erase of all I/O subsectors is commenced, wherein the region A and region B portions of the memory sector are concurrently erased via pulses of about 10 milliseconds to 1 millisecond, respectively. This is illustrated at line D of FIG. 3c. It is to be appreciated that a plurality of other sequences and timings may be applied to the region A and B portions of the memory sector 20.

Figure 4:
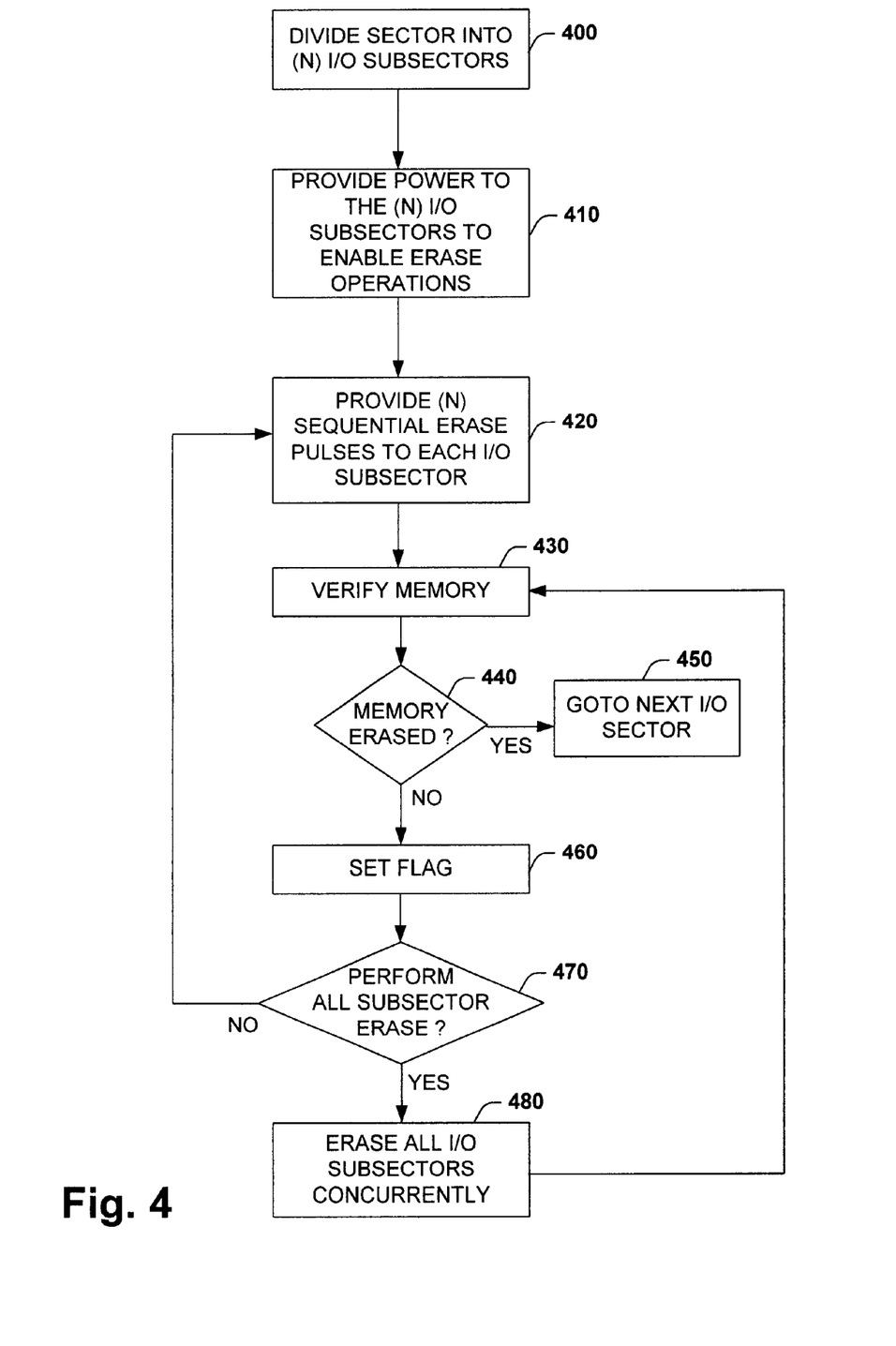
FIG. 4 is a flow chart diagram illustrating a methodology for providing I/O partitioning in accordance with the present invention.

Referring now to FIG. 4, a flow diagram illustrates a methodology for providing a partitioned erase in accordance with the present invention. At step 400, a memory sector, such as a 1 Mbyte sector, is divided into N I/O subsectors, wherein each I/O subsector may be individually erased via a separate erase pulse, if necessary. At step 410, drain pump power is applied to the memory sector to enable erasing of the memory cells for each of the N I/O subsectors. At step 420, N sequential erase pulses are generated and provided to each I/O subsector defined in step 400. At step 430, the memory locations within the memory sector are read and verified to determine if each location has been erased properly. At step 440, a determination is made as to whether each memory location was erased properly. As described above, this may be determined by observing a pass/fail indicator flag. If the memory sector has been properly erased at step 440 (e.g., pass/fail flag=pass), then the process proceeds to step 450 and proceeds to the next memory sector within the Flash memory. If the memory sector is not erased adequately at step 440, the process proceeds to step 460 and sets a first flag (e.g., increments a counter) indicating that the memory sector has been sequentially erased a first time. At step 470, if the first flag is set indicating that memory has been sequentially erased a first time, the process proceeds back to step 420 and repeats steps 420 through 440.

At step 440, the pass/fail flag is again checked to determine if memory has been erased. If memory has been erased at step 440, the process proceeds to step 450 to erase the next memory sector. If memory has not been erased, the process proceeds to step 460. At step 460, since the first flag was previously set, a second flag is set indicating that memory was sequentially erased a second time. At step 470, since the second flag is now set, the process proceeds to step 480 and proceeds to erase all I/O subsectors of the memory sector concurrently. The process then proceeds back to step 430 and performs a verify sequence. Although in the above example, the method proceeded to an erase of all I/O subsectors substantially concurrently after one sequential erase, multiple substantially sequential I/O subsector erase steps may be employed prior to a concurrent I/O subsector erase and such variations are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description or the claims, such term is intended to be inclusive in a manner similar to the term "comprising".

What is claimed is:

1. A system for reducing band-to-band tunneling current during Flash memory erase operations, comprising:

at least one memory sector divided into (N) I/O subsectors, N being an integer;

a drain pump operable to generate power for associated erase operations within the N I/O subsectors; and an erase sequencing subsystem for generating N pulses to enable the erase operations within each of the N I/O subsectors, respectively.

2. A system for reducing band-to-band tunneling current during Flash memory era operations, comprising:

at least one I/O memory sector divided into (N) subsectors, N being an integer;

a drain pump operable to generate power for associated erase operations within the N subsectors; and an erase sequencing subsystem for generating N pulses to enable the erase operations within each of the N subsectors, respectively, wherein the erase sequencing subsystem is operable to configure the N pulses to erase each subsector substantially sequentially.

3. The system of claim 2, wherein the erase sequencing subsystem is further operable to provide one or more erase pulses to substantially concurrently erase multiple I/O subsectors after a predetermined number of sequential erase cycles.

4. The system of claim 3, the erase sequencing subsystem further comprising counting logic to enable a determination of when to erase all I/O subsectors concurrently.

5. The system of claim 4, wherein the erase sequencing subsystem is operable to erase the N subsectors substantially sequentially with the N pulses a first time, erase the N subsectors substantially sequentially again with the N pulses a second time, and then erase all of the N subsectors substantially concurrently according to a single pulse.

6. The system of claim 5, wherein the at least one memory sector is divided into 16 I/O subsectors and erased via 16 associated erase pulses by the erase sequencing subsystem and the drain pump.

7. The system of claim 2, the erase sequencing subsystem further comprising a drain pump enable signal to enable power to the drain pump for erase operations within the N I/O subsectors.

8. The system of claim 2, the erase sequencing subsystem further comprising an ALL flag indicating that a predetermined number of sequential erase pulses have been generated and to indicate that further erase operations are to be directed to the I/O subsectors substantially concurrently.

9. The system of claim 2, the erase sequencing subsystem further comprising a MAX I/O flag indicating that the N pulses have been generated.

10. The system of claim 7, the erase sequencing subsystem further comprising a timeout timer, wherein the timeout timer generates a timer output signal to disable the drain pump enable signal.

11. The system of claim 10, the erase sequencing subsystem further comprising an erase verification system that is enabled after the drain pump is disabled.

12. The system of claim 11, the erase sequencing subsystem further comprising a start timer for delaying an enablement of the erase verification system.

13. The system of claim 11, wherein the erase verification system is operable to read each memory cell within the at least one memory sector in order to determine if each memory cell is adequately erased.

14. The system of claim 13, wherein the erase verification system is operable to determine whether each memory cell is adequately erased by evaluating whether a threshold voltage or current associated with each memory cell is above or below a predetermined threshold value.

15. The system of claim 14, wherein the erase verification system is operable to output a pass verification indicator if each cell is below the predetermined threshold voltage and a fail verification indicator if any of the cells are above the predetermined threshold voltage.

16. The system of claim 13, wherein the erase verification system is operable to output a verify complete flag to indicate that the at least one sector has been verified.

17. The system of claim 1, wherein the at least one memory sector further comprises about one half of a megabyte of memory cells.

18. The system of claim 17, wherein the memory cells further comprises a single bit storage architecture memory cell.

19. The system of claim 17, wherein the memory cells further comprises a multiple bit storage architecture memory cell.

20. The system of claim 19, wherein the multiple bit storage architecture memory cell further comprises an A storage portion and a B storage portion.

21. The system of claim 20, wherein the A storage portion and the B storage portion are sequentially erased via the N erase pulses.

22. The system of claim 20, wherein the A storage portion of all the memory cells in a memory sector is sequentially erased via the N erase pulses and the B storage portion of all the memory cells in the memory sector is erased via a single erase pulse.

23. The system of claim 20, wherein the A storage portion of all the memory cells in an memory sector is sequentially erased via the N erase pulses of about 10 milliseconds in duration and the B storage portion of all the memory cells in the memory sector is erased via a single erase pulse of about 1 millisecond in duration.

24. The system of claim 21, wherein the B storage portion is erased via a single erase pulse of about 1 millisecond in duration after the A storage portion was previously sequentially erased via N erase pulses of about 10 milliseconds in duration.

25. A method for reducing band-to-band tunneling current during Flash memory erase operations, comprising the steps of:
dividing an I/O memory sector into (N) subsectors, N being an integer;
generating power for associated erase operations within the N subsectors; and
generating N pulses to enable the erase operations within each of the N subsectors, respectively, in order to reduce band-to-band tunneling current provided by a drain pump.

26. The method of claim 25, further comprising at least one of the following steps:
erasing each I/O subsector substantially sequentially; and
erasing all I/O subsectors substantially concurrently subsequent to erasing each subsector substantially sequentially.

27. The method of claim 26, further comprising counting pulses to determine when to erase all I/O subsectors substantially concurrently.

28. The method of claim 27, wherein generating N pulses to enable erase operations comprises:
erasing the N I/O subsectors sequentially according to a first set of N pulses;
erasing the N I/O subsectors sequentially according to a second set of N pulses; and
subsequently erasing all of the N I/O subsectors substantially concurrently according to a single pulse.

29. A system for reducing band-to-band tunneling current during Flash memory erase operations, comprising:
means for dividing a memory sector into (N) I/O subsectors, N being an integer;
means for generating power for associated erase operations within the N I/O subsectors; and
means for generating N pulses to enable the erase operations within each of the N I/O subsectors, respectively, in order to reduce band-to-band tunneling current provided by the drain pump.

30. The system of claim 29, further comprising:
means for erasing each I/O subsector substantially sequentially; and
means for erasing all I/O subsectors substantially concurrently subsequent to erasing each subsector substantially sequentially.

31. The system of claim 30, further comprising means for counting pulses to determine when to erase all I/O subsectors substantially concurrently.

32. The system of claim 31, further comprising:
means for erasing the N I/O subsectors substantially sequentially according to a first set of N pulses;
means for erasing the N I/O subsectors substantially sequentially according to a second set of N pulses; and
means for erasing all of the N I/O subsectors substantially concurrently according to a single pulse.

33. A Flash memory, comprising:
- a plurality of memory sectors, wherein each memory sector includes a plurality of I/O subsectors;
- a drain pump to generate power for associated erase operations within the plurality of I/O subsectors; and
- an erase sequencing subsystem for generating a plurality of pulses associated with the plurality of I/O subsectors to enable the erase operations within each of the plurality of I/O subsectors, in order to reduce band-to-band tunneling current provided by the drain pump, wherein the erase sequencing subsystem is operable to erase the plurality of I/O subsectors individually in a substantially sequential manner and subsequently erase the plurality of I/O subsectors in a substantially concurrent manner.

* * * * *

UNITED STATES PATENT AND TRADEMARK OFFICE
CERTIFICATE OF CORRECTION

PATENT NO.   : 6,385,093 B1
DATED        : May 7, 2002
INVENTOR(S)  : Edward V. Bautista, Jr., Kazuhiro Kurihara, Feng Pan, Weng Fook Lee, Ravi Sunkavalli and Darlene Hamilton It is certified that error appears in the above-identified patent and that said Letters Patent is hereby corrected as shown below:

<u>Column 6,</u>
Line 20, please delete the number "10" after the phrase "input of the".

Signed and Sealed this

Tenth Day of September, 2002

Attest:

Attesting Officer

JAMES E. ROGAN
*Director of the United States Patent and Trademark Office*